(12) United States Patent
Wen et al.

(10) Patent No.: US 7,863,975 B2
(45) Date of Patent: Jan. 4, 2011

(54) METHOD FOR CALIBRATING A POWER AMPLIFIER AND DEVICE USING THE SAME

(75) Inventors: Chun-Hsien Wen, Hsinchu County (TW); Yun-Shen Chang, Hsinchu County (TW); Wen-Sheng Hou, Hsinchu County (TW); Chien-Cheng Lin, Taichung County (TW); Jiunn-Tsair Chen, Hsinchu County (TW)

(73) Assignee: Ralink Technology Corp., Jhubei, Hsinchu County (TW)

( * ) Notice: Subject to any disclaimer, the term of this patent is extended or adjusted under 35 U.S.C. 154(b) by 15 days.

(21) Appl. No.: 12/465,623

(22) Filed: May 13, 2009

(65) Prior Publication Data

US 2010/0026385 A1 Feb. 4, 2010

(30) Foreign Application Priority Data

Jul. 31, 2008 (TW) .............................. 97128977 A

(51) Int. Cl.
*G01R 19/00* (2006.01)
(52) U.S. Cl. .......................................... 330/2; 330/279
(58) Field of Classification Search ..................... 330/2, 330/279, 149; 375/297; 455/114.3
See application file for complete search history.

(56) References Cited

U.S. PATENT DOCUMENTS

| 3,794,931 | A * | 2/1974 | Albrecht et al. | 330/279 |
|---|---|---|---|---|
| 4,987,383 | A * | 1/1991 | Mauthe | 330/279 |
| 6,963,242 | B2 * | 11/2005 | White et al. | 330/149 |
| 7,327,191 | B2 * | 2/2008 | Shako et al. | 330/149 |
| 7,403,573 | B2 * | 7/2008 | DeBruyn et al. | 375/297 |
| 7,724,090 | B2 * | 5/2010 | Lin et al. | 330/279 |
| 2003/0184372 | A1 * | 10/2003 | Fudaba et al. | 330/149 |
| 2005/0017801 | A1 * | 1/2005 | Bachman et al. | 330/149 |
| 2010/0001795 | A1 * | 1/2010 | Shi et al. | 330/149 |

\* cited by examiner

*Primary Examiner*—Henry K Choe
(74) *Attorney, Agent, or Firm*—Winston Hsu; Scott Margo

(57) ABSTRACT

A calibration device for a power amplifier includes a calculation unit, a first storage unit and a multiplier. The calculation unit is utilized for generating a calibration factor according to a value of a characteristic parameter of the power amplifier. The first storage unit coupled to the calculation unit, for storing the calibration factor. The multiplier is coupled to the first storage unit and a baseband unit, for multiplying a baseband signal outputted from the baseband unit by the calibration factor for generating an input signal to the power amplifier.

13 Claims, 3 Drawing Sheets

METHOD FOR CALIBRATING A POWER AMPLIFIER AND DEVICE USING THE SAME

BACKGROUND OF THE INVENTION

1. Field of the Invention

The present invention relates to a calibration method and related device for a power amplifier, and more particularly, to a calibration method and related device for enhancing output linearity of the power amplifier according to characteristic parameters of the power amplifier.

2. Description of the Prior Art

A power amplifier is the most important component in radio frequency circuitry of a wireless communications system. A power amplifier with large output power usually exhibits output power saturation and low output linearity, which results in decreased output signal quality. It is therefore an important issue to avoid output signal distortion and enhance output linearity of the power amplifier.

A predistortion method, which performs digital signal processing on baseband signals through a predistorter, compensates for signal distortion resulting from nonlinear characteristics of the power amplifier for enhancing output linearity. Please refer to FIG. 1, which is a calibration circuit 10 according to the prior art. The calibration circuit 10 implements the conventional predistortion method. The calibration circuit 10 comprises a predistorter 100, a D/A converter 102, a power amplifier 104, an analog processing unit 106, an A/D converter 108 and a signal generator 110, which form a closed loop to perform the predistortion method for enhancing output linearity of the power amplifier 104. The predistorter 100 performs a signal compensation process on a digital input signal to compensate for signal distortion of the power amplifier 104 in advance. The D/A converter 102 converts the input signal to an analog output signal, and the power amplifier 104 amplifies the output signal.

At the same time, the analog processing unit 106 coupled to the output terminal of the power amplifier 104 performs a signal process on the output signal outputted by the power amplifier 104, and the A/D converter 108 converts the output signal to a digital signal. The signal generator 110 receives the digital signal and generates a calibration signal, which is sent to the predistorter 100, according to the digital signal. Therefore, the predistorter 100 performs the signal compensation process on a next digital input signal according to the calibration signal.

From the above, the calibration circuit 10 generates the calibration signal via a complicated circuit including the analog processing unit 106, the A/D converter 108 and the signal generator 110. Using the calibration circuit 10 to enhance output linearity of a power amplifier is also expensive.

SUMMARY OF THE INVENTION

It is therefore a primary objective of the claimed invention to provide a calibration method and related device for a power amplifier.

The present invention discloses a calibration device for a power amplifier. The calibration device comprises a calculation unit, a first storage unit and a multiplier. The calculation unit is utilized for generating a calibration factor according to a value of a characteristic parameter of the power amplifier. The first storage unit is coupled to the calculation unit and is utilized for storing the calibration factor. The multiplier is coupled to the first storage unit and a baseband unit and is utilized for multiplying a baseband signal outputted from the baseband unit by the calibration factor, for generating an input signal to the power amplifier.

The present invention further discloses a calibration method for a power amplifier. The calibration method comprises generating a calibration factor according to a value of a characteristic parameter of the power amplifier, storing the calibration factor, multiplying a baseband signal by the calibration factor for generating an input signal, and outputting the input signal to the power amplifier.

These and other objectives of the present invention will no doubt become obvious to those of ordinary skill in the art after reading the following detailed description of the preferred embodiment that is illustrated in the various figures and drawings.

DETAILED DESCRIPTION

As mentioned previously, the conventional predistortion method can be implemented in a closed-loop calibration circuit but has an expensive cost. The present invention provides a calibration device as a predistorter for a power amplifier, which forms an open-loop circuit for the power amplifier, and not only enhances output linearity of the power amplifier, but also has reduced cost.

Figure 2:
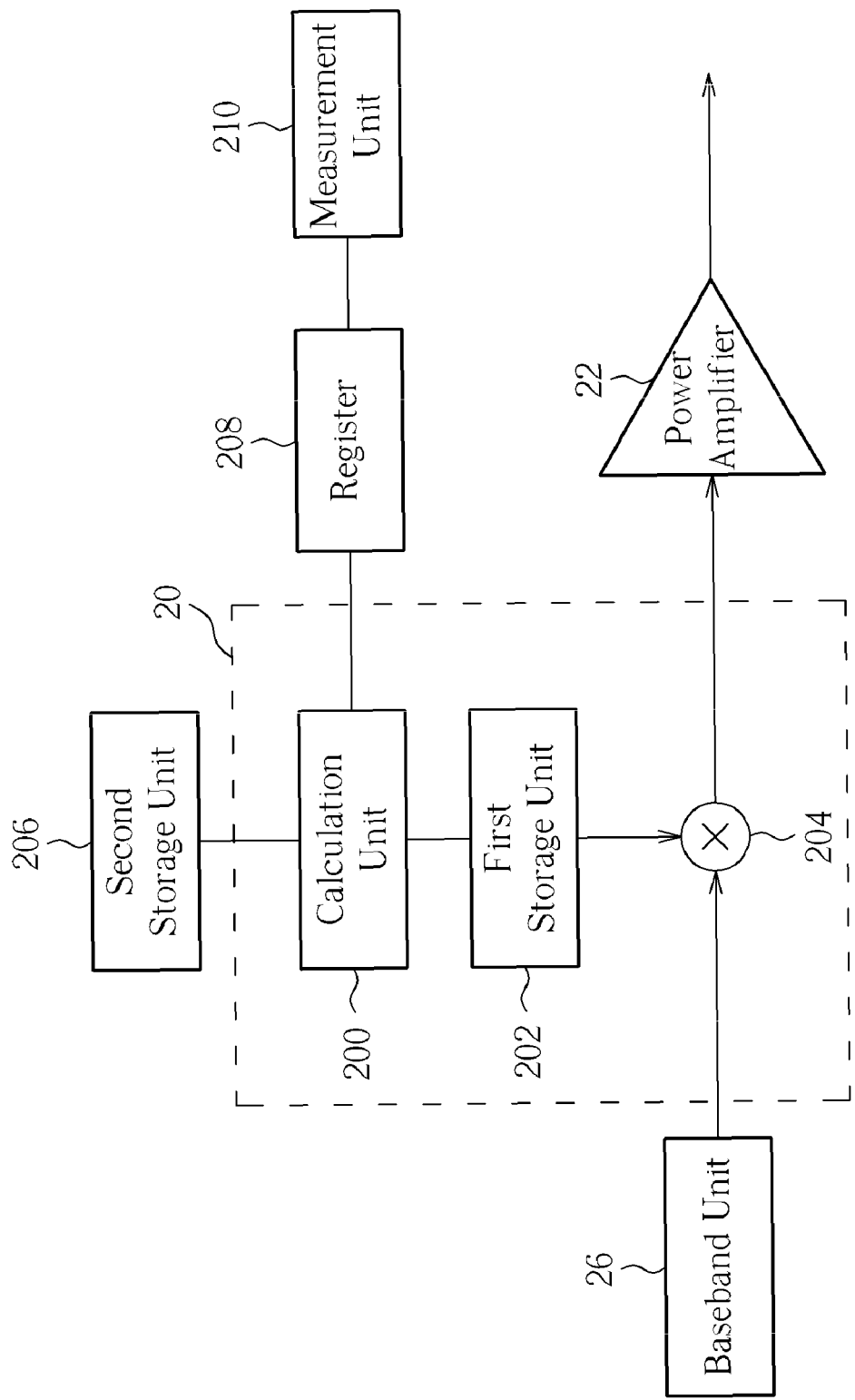
FIG. 2 is a schematic diagram of a calibration device according to an embodiment of the present invention.

Please refer to FIG. 2, which is a schematic diagram of a calibration device 20 according to an embodiment of the present invention. The calibration device 20 is an open-loop calibration device for performing a signal compensation process on an input signal of a power amplifier 22 for enhancing output linearity of the power amplifier 22. The calibration device 20 comprises a calculation unit 200, a first storage unit 202 and a multiplier 204. The calculation unit 200 is utilized for generating a calibration factor according to a value of a characteristic parameter of the power amplifier 22. The characteristic parameter used by the calculation unit 200 may be device temperature of the power amplifier 22 (or ambient temperature of where the power amplifier 22 is located, if the device temperature is not easy to measure), gain of the power amplifier 22, or any other characteristic parameter which may influence output linearity of the power amplifier 22.

Figure 1:
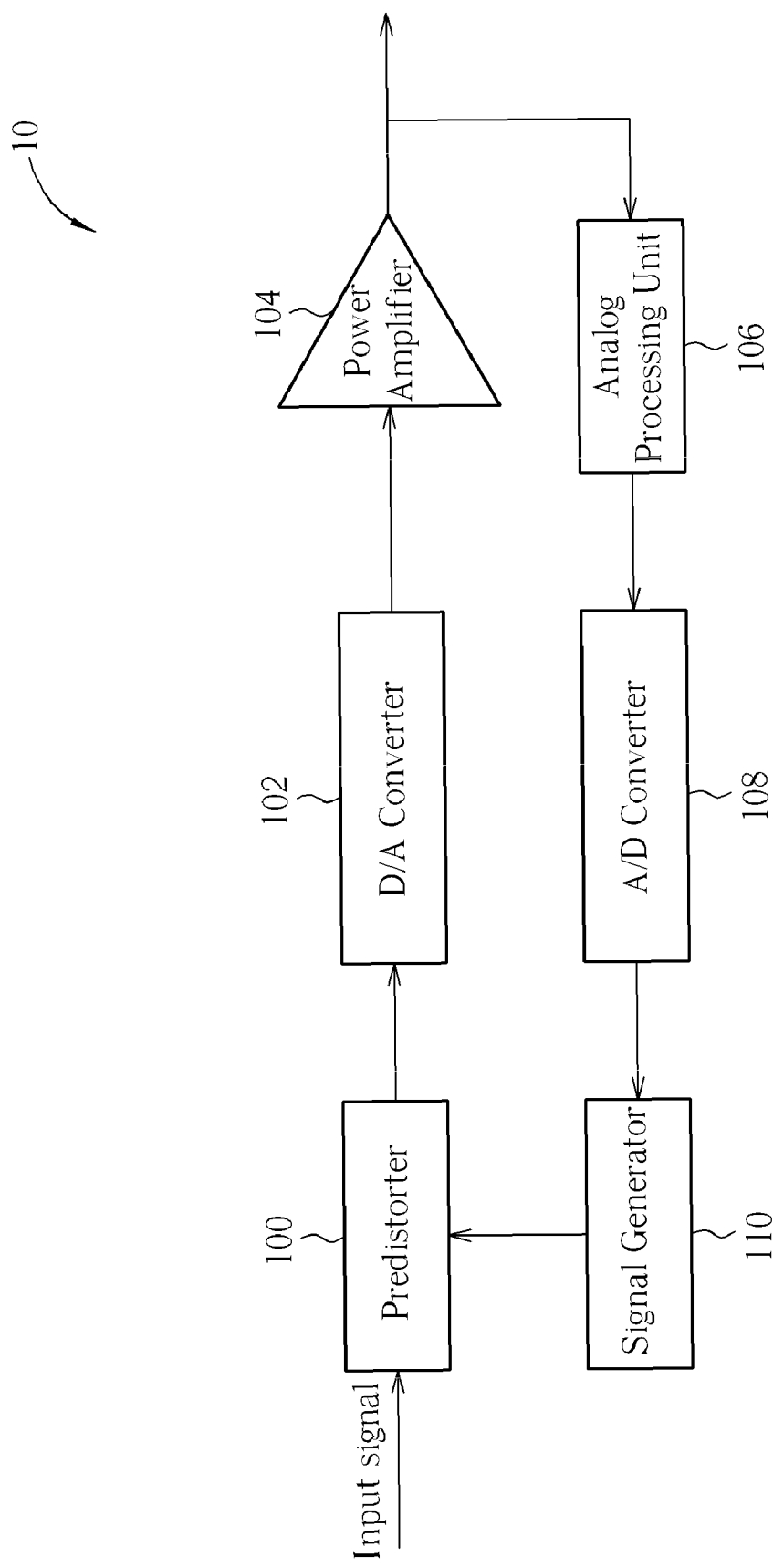
FIG. 1 is a schematic diagram of a close-loop calibration device of a power amplifier according to the prior art.

The first storage unit 202 is coupled to the calculation unit 200 and is utilized for storing the calibration factor. The multiplier 204 is coupled to the first storage unit 202 and a baseband unit 26, and is utilized for multiplying a digital baseband signal outputted from the baseband unit 26 by the calibration factor for generating an input signal sent to the power amplifier 22. Please note that, a D/A converter between the multiplier 204 and the power amplifier 22 is omitted in FIG. 1. From the above, what the power amplifier 22 amplifies is generated by the calibration device 20. Therefore, output linearity when the power amplifier 22 has large output power is enhanced. Note that, in another embodiment of the present invention, the calculation unit 200 can generate the calibration factor according to more than one characteristic parameter.

In FIG. 2, the calculation unit 200 is further coupled to a second storage unit 206 and a register 208, and the register 208 is further coupled to a measurement unit 210. The measurement unit 210 measures the characteristic parameter of the power amplifier 22, such as temperature or gain, in real-time, and the register 208 stores the measured value of the characteristic parameter. The calculation unit 200 receives the value of the characteristic parameter from the register 208 and generates the calibration factor by interpolation according to a plurality of look-up tables stored in the second storage unit 206.

For example, suppose the characteristic parameter of the power amplifier 22 is temperature. The second storage unit 206 stores two look-up tables, L1 and L2. L1 includes a calibration factor E1 corresponding to 0° C., and L2 includes a calibration factor E2 corresponding to 60° C. If the measured temperature of the power amplifier 22 is 35° C., the calculation unit 200 generates a calibration factor E3 corresponding to 35° C. by interpolation according to the calibration factors E1 and E2, and puts the calibration factor E3 into the first storage unit 202. Next, the multiplier 204 multiplies the baseband signal by the calibration factor E3 to generate the input signal sent to the power amplifier 22.

In addition, considering the characteristic parameter, such as temperature, may change dramatically, the calculation unit 200 may generate the calibration factor periodically. In other words, the calculation unit 200 periodically receives the value of the characteristic parameter from the register 208 to generate the calibration factor correspondingly. Therefore, the calibration factor is renewed in response to variation of the characteristic parameter for precisely compensating for signal distortion. Please note that, the register 208 and the measurement unit 210 are used in a general radio frequency circuit including the power amplifier 22, so that the embodiment of the present invention does not require adding new circuits, but uses the existing units to measure the value of the characteristic parameter. As mentioned previously, it is expensive to implement a conventional closed-loop calibration circuit for a power amplifier. In comparison, the calibration device 20 is implemented with a simple open-loop structure, which can save production cost.

In summary, the calculation unit 200 generates the calibration factor; the first storage unit 202 stores the calibration factor; and the multiplier 204 generates the input signal of the power amplifier 22 according to the calibration factor. The baseband signal is compensated for signal distortion resulting from the power amplifier 22 in advance and output linearity of the power amplifier 22 is therefore enhanced. In addition, the calculation unit 200 generates the calibration factor periodically so the baseband signal can be compensated more precisely according to variation of the characteristic parameter of the power amplifier 22.

Figure 3:
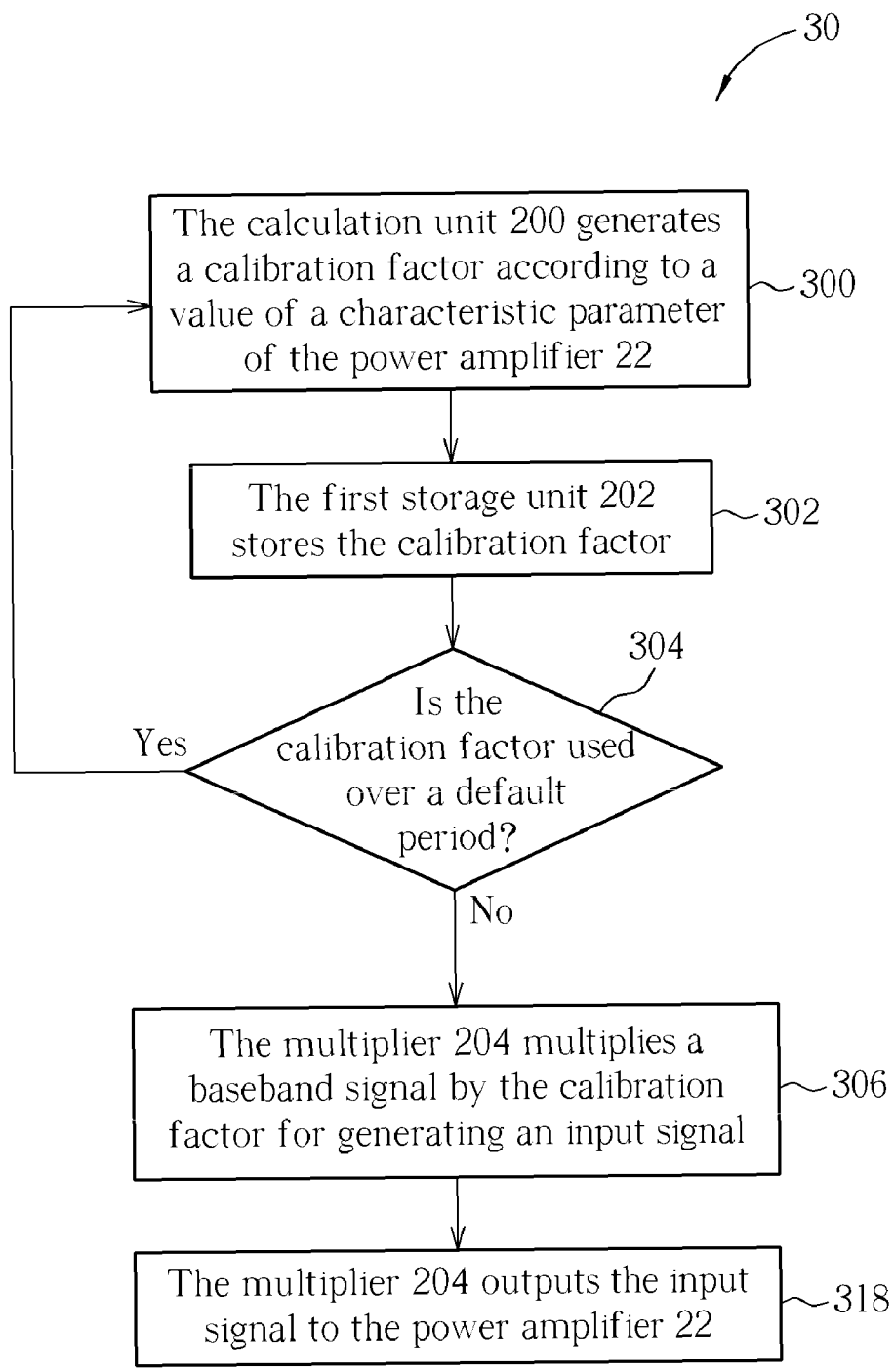
FIG. 3 is a flowchart of a calibration process according to an embodiment of the present invention.

Please refer to FIG. 3, which is a flowchart of a calibration process 30 according to an embodiment of the present invention. The calibration process 30 illustrates operations of the calibration device 20. The calibration process 30 comprises the following steps:

Step 300: The calculation unit 200 generates a calibration factor according to a value of a characteristic parameter of the power amplifier 22.

Step 302: The first storage unit 202 stores the calibration factor.

Step 304: The calculation unit 200 determines if the calibration factor is used over a default period. If the calibration factor is used over the default period, go to Step 300; otherwise, perform Step 306.

Step 306: The multiplier 204 multiplies a baseband signal by the calibration factor for generating an input signal.

Step 308: The multiplier 204 outputs the input signal to the power amplifier 22.

Please refer to FIG. 2 and FIG. 3. First, in the calibration process 30, the calculation unit 200 generates the calibration factor according to the value of the characteristic parameter, and the first storage unit 202 stores the calibration factor. If the calibration device 20 always uses the same calibration factor, the calibration device 20 may not perform predistortion compensation precisely for the power amplifier 22 when the ambient temperature of the power amplifier 22 changes dramatically. The calibration factor should be renewed periodically. According to Step 304, the calibration factor is renewed by the calculation unit 200, which determines if the calibration factor is used over a default period. If the calibration factor is not used over the default period, the multiplier 204 multiplies the baseband signal by the calibration factor to generate the input signal to the power amplifier 22. If the calibration factor is used over the default period, the calculation unit 200 generates the calibration factor again to ensure the calibration factor responds exactly to the variation of the characteristic parameter. Detailed description of how the calibration factor is generated is described previously and not repeated here.

In conclusion, the embodiment of the present invention performs predistortion compensation on the baseband signal according to the calibration factor for compensating for non-linearity of the power amplifier. Furthermore, the embodiment of the present invention periodically renews the calibration factor, so that the compensation is performed more precisely, and output linearity of the amplifier is enhanced.

Those skilled in the art will readily observe that numerous modifications and alterations of the device and method may be made while retaining the teachings of the invention.

What is claimed is:

1. A calibration device for a power amplifier, the calibration device comprising:
    a calculation unit, for generating a calibration factor according to a value of a characteristic parameter of the power amplifier and a plurality of lookup tables;
    a first storage unit coupled to the calculation unit, for storing the calibration factor;
    a second storage unit coupled to the calculation unit, for storing the plurality of lookup tables; and
    a multiplier coupled to the first storage unit and a baseband unit, for multiplying a baseband signal outputted from the baseband unit by the calibration factor for generating an input signal to the power amplifier.

2. The calibration device of claim 1, wherein the calculation unit generates the calibration factor periodically.

3. The calibration device of claim 1, wherein the calculation unit generates the calibration factor by interpolation according to the plurality of look-up tables stored in the second storage unit.

4. The calibration device of claim 1, wherein the calculation unit is coupled to a register storing the value of the characteristic parameter.

5. The calibration device of claim 4, wherein the register is coupled to a measurement unit utilized for measuring the characteristic parameter of the power amplifier.

6. The calibration device of claim 1, wherein the characteristic parameter is temperature of the power amplifier.

7. The calibration device of claim 1, wherein the characteristic parameter is gain of the power amplifier.

8. A calibration method for a power amplifier comprising:
generating a calibration factor by using interpolation according to a value of a characteristic parameter of the power amplifier and a plurality of look-up tables;
storing the calibration factor;
multiplying a baseband signal by the calibration factor for generating an input signal; and
outputting the input signal to the power amplifier.

9. The calibration method of claim 8, further comprising generating the calibration factor periodically.

10. The calibration method of claim 8, further comprising measuring the characteristic parameter of the power amplifier.

11. The calibration method of claim 8, further comprising storing the value of the characteristic parameter.

12. The calibration method of claim 8, wherein the characteristic parameter is temperature of the power amplifier.

13. The calibration method of claim 8, wherein the characteristic parameter is gain of the power amplifier.

* * * * *